(12) United States Patent
Hong

(10) Patent No.: US 6,710,510 B1
(45) Date of Patent: Mar. 23, 2004

(54) METHOD AND APPARATUS FOR MODIFYING ACOUSTIC WAVE CHARACTERISTICS

(75) Inventor: John Hong, Thousand Oaks, CA (US)

(73) Assignee: Rockwell Technologies, LLC., Thousand Oaks, CA (US)

(*) Notice: Subject to any disclaimer, the term of this patent is extended or adjusted under 35 U.S.C. 154(b) by 17 days.

(21) Appl. No.: 09/672,682

(22) Filed: Sep. 28, 2000

(51) Int. Cl.[7] .............................................. H01L 41/08
(52) U.S. Cl. ...................................................... 310/313 R
(58) Field of Search ............ 310/313 R, 313 A–313 D; 333/150–153, 165, 195

(56) References Cited

U.S. PATENT DOCUMENTS 3,621,482 A * 11/1971 Adler .......................... 333/193
3,706,055 A * 12/1972 Dieulesaint ............. 310/313 B
4,620,167 A * 10/1986 Brooks et al. ............... 333/195
5,243,307 A *  9/1993 Grudkowki ............. 310/313 R

* cited by examiner

Primary Examiner—Thomas M. Dougherty
Assistant Examiner—Karen Addison
(74) Attorney, Agent, or Firm—Foley & Lardner

(57) ABSTRACT

Acoustic wave characteristics varied by illumination of the acoustic wave propagation medium. An acoustic wave is generated and propagated on or through a medium, typically a piezoelectric substrate. The medium is illuminated, creating a charge grating. The velocity of the acoustic wave is altered and certain frequency components of the acoustic wave are reflected. Transducers may be used to extract the selected frequency. The characteristics of the illumination, including, among others, the wavelength and the intensity, may be varied to produce various acoustic wave velocities and to select particular acoustic wave frequency components.

35 Claims, 6 Drawing Sheets

METHOD AND APPARATUS FOR MODIFYING ACOUSTIC WAVE CHARACTERISTICS

BACKGROUND

1. Field of the Invention

The present invention relates to the field of acoustic wave processing. Particular embodiments of the invention relate to methods and devices that modify the characteristics of acoustic waves, such as variable bandwidth acoustic wave filters and acoustic wave delay devices.

2. Related Art

The demand for products based on solid state technology in the consumer, industrial and military markets continues to grow at a rapid rate. For example, in the consumer telecommunications market, some forecasts estimate that mobile phone sales will reach an astounding 750 million to 1 billion units by 2003. Commensurate with this demand is a demand for the components inside these products, including signal processing components relying on acoustic wave phenomena. Acoustic wave devices, such as surface acoustic wave (SAW) and bulk acoustic wave (BAW) devices, are used frequently in products such as televisions, cell phones and pagers.

One application for acoustic wave devices is in electronic signal filtering. Electronic filters are ubiquitous and are available in a variety of technologies. For example, in cellular telephones, filters may be implemented using analog technology, as in charge coupled devices (CCDs), digital technology, as in finite impulse response (FIR) filters, or acoustic wave technology, all of which are well-known in the art. Analog and digital filters are versatile in the sense that the frequency response of these filters can be varied. These filters, however, suffer from an inability to directly address high frequency applications, such as, for example, applications in the vast majority of wireless communications markets, either because of fundamental component frequency limitations or an adverse power-speed relationship. This is troublesome for many designers, especially those designing in the wireless electronics area, where bandwidth and frequency of operation continue to increase and power is at a premium. In some applications, the power consumption of analog and digital filters is too great for these filters to be viable as design solutions. Filters based on acoustic wave technology, however, which consume very little power in relation to analog and digital filters, offer a viable solution to this problem.

However, acoustic wave devices have not been without their problems. Historically, acoustic wave devices have been limited in flexibility. For example, SAW filters are typically used for fixed filter applications. Once fabricated, a SAW filter is fixed with respect to bandwidth and center frequency. If a different frequency response is desired, a new SAW filter must be substituted.

There have been attempts to address this problem. In U.S. Pat. No. 3,446,974, issued to Seiwatz, a solid state acoustic signal translating device, such as a surface acoustic wave filter, is described in which a photoconductive film contacts the surface electrodes of the device transducer. An optical system illuminates selected portions of the photoconductive film to establish various connections between electrodes, thereby varying the frequency response of the device, which is dependent upon the particular electrodes activated. This approach to vary the frequency response of the device has several disadvantages: there is substantial loss due to the resistive drop across the electrodes; the shape of the filter changes dramatically as different electrodes are selected; and, electrode selection is not arbitrary due to the predefined electrode pattern.

A purported improvement on the Seiwatz device is described in U.S. Pat. No. 3,621,482, issued to Adler. The Adler device is essentially a plurality of SAW filters selectively coupled together via a photoconductive material. Although the Adler device may improve upon the resistive loss problem of the Seiwatz device, the number of filter structures needed for the Adler device grows in proportion to the number of frequency selections to be made. This may make the Adler device too costly, too cumbersome or otherwise unusable in many instances.

Another approach is described in U.S. Pat. No. 4,099,206, issued to Desbois et al. The Desbois device consists of a substrate of piezoelectric material upon which is deposited an interdigital network and electro-acoustic transducers. The interdigital network is covered by, but electrically isolated from, a photoconductive medium. Illumination of the photoconductive material affects the conductivity of the network, thereby influencing the surface acoustic wave generated and received buy the transducers. This device also suffers from resistive losses, and its tunability is limited, as in the Seiwatz device, by the predefined geometry of the network.

Thus, there is a need to provide a method and apparatus for varying the frequency characteristics of acoustic waves, without the resistive losses of previous devices and with tunability that does not rely on a predefined control structure.

SUMMARY

Embodiments of the present invention are directed to methods and apparatuses that address this need. In one embodiment, a method for modifying the characteristics of an acoustic wave comprises the steps of providing a medium for acoustic wave propagation, generating an acoustic wave, propagating the acoustic wave using the medium, and illuminating the medium during the propagation of the acoustic wave. The medium may be a piezoelectric substrate. A transducer may be formed on the piezoelectric substrate, and the transducer may generate the acoustic wave. Further, the medium may be illuminated using a laser diode or a light-emitting diode. The method may also comprise the step of varying the intensity of the light generated by the light-emitting diode or laser diode. The intensity of the light may be varied by a controller or a light modulator. The method may also comprise the step of reading a selected frequency component of the acoustic wave.

Another embodiment of the present invention is directed toward a method for modifying the characteristics of an acoustic wave comprising the steps of generating an acoustic wave in a medium and varying a velocity of the acoustic wave. This medium may also be a piezoelectric substrate. The velocity of the acoustic wave may be varied by illuminating the medium. Further, a transducer may be formed on the piezoelectric substrate and the acoustic wave may be generated by the transducer. In addition, the method of this embodiment may also comprise the step of reading a selected frequency component of the acoustic wave.

Another embodiment of the present invention is directed toward an apparatus for varying the characteristics of an acoustic wave comprising a medium for acoustic wave propagation, a transducer formed on the medium, and a light source illuminating the medium. The medium may be a piezoelectric substrate and the acoustic wave may be generated by the transducer. The light source may be a laser diode or a light-emitting diode and the intensity of the light generated by either light source may be varied. To vary the intensity of the light, a controller or a light modulator may be used. In the apparatus, a selected frequency component of the acoustic wave may be read from the transducer.

Another embodiment of the present invention is directed toward a method for making an acoustic wave device comprising the steps of providing a medium for acoustic wave propagation, forming a transducer on the medium and providing a light source for illuminating the medium. The medium may be a piezoelectric substrate. The light source may be a laser diode or a light-emitting diode. The method may also comprise the step of providing means for varying an intensity of a light generated by the light-emitting diode. The means for varying the intensity of the light may comprise a controller or a light modulator.

Another embodiment of the present invention is directed toward an apparatus for varying the characteristics of an acoustic wave comprising a medium for acoustic wave propagation and a transducer formed on the medium, wherein a light source is used to illuminate the medium. The medium may be a piezoelectric substrate. The transducer may generate an acoustic wave. The light source may be a laser diode or a light-emitting diode. In this embodiment, an intensity of a light generated by the laser diode or light-emitting diode is varied, preferably by a controller or a light modulator. A selected frequency component of the acoustic wave is read from the transducer.

Another embodiment of the present invention is directed toward a method for modifying the characteristics of an acoustic wave comprising the steps of providing a medium for acoustic wave propagation, generating an acoustic wave, propagating the acoustic wave using the medium, and inducing a charge grating in the medium during the propagation of the acoustic wave. The medium may be a piezoelectric substrate and a transducer may be formed on the piezoelectric substrate.

Another embodiment of the present invention is directed toward a method for making an acoustic wave device comprising the steps of providing a medium for acoustic wave propagation, forming a transducer on the medium, and providing a light source for inducing a charge grating in the medium. The medium may be a piezoelectric substrate. The light source may be a laser diode or a light-emitting diode. The method may also comprise the step of providing means for varying an intensity of a light generated by the light-emitting diode, wherein the means for varying the intensity of the light comprises a controller or a light modulator.

BRIEF DESCRIPTION OF THE DRAWINGS

These and other features, aspects, and advantages of the present invention will become better understood when viewed in light of the accompanying drawings where.

DETAILED DESCRIPTION

The present invention relies on the change in propagation velocity and the reflection of various components of acoustic waves across or through a medium due to an optically induced charge grating. Implementations of the present invention may be accomplished in a variety of ways; however, for purposes of illustration a typical SAW device will be described as a representative example.

SAW devices are well-known in the art and will be described here only briefly. SAW devices take advantage of the properties of acoustic waves and typically utilize piezoelectric materials. In a SAW device, acoustic waves may propagate along the SAW surface (i.e., the substrate of the SAW device). If the SAW surface is a piezoelectric material, the surface acoustic energy is accompanied by a small amount of electromagnetic energy. This electronic energy provides the mechanism by which the acoustic and electric fields may be coupled, thus converting a propagating surface acoustic wave into an electromagnetic signal and vice versa.

Figure 1:
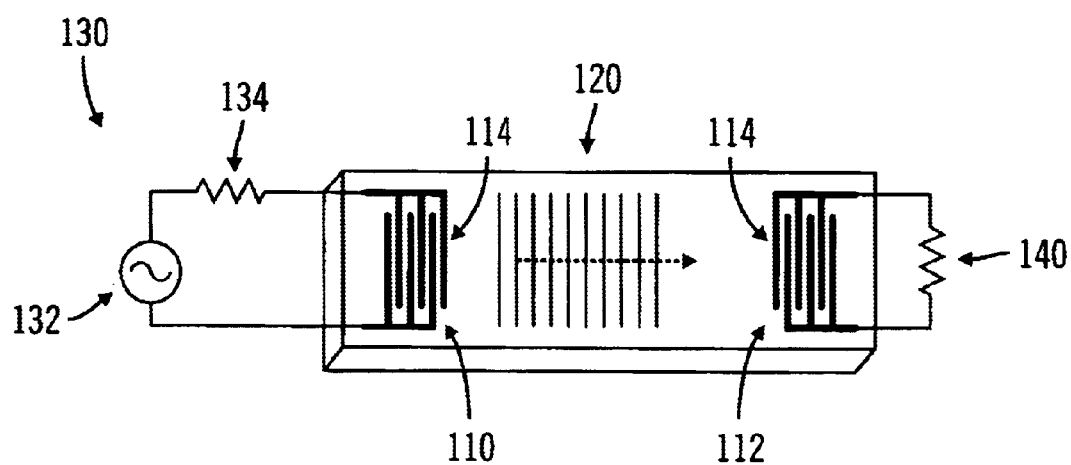
FIG. 1 is a perspective view of the prior art.

A basic SAW device is shown in FIG. 1. Transducers 110, 112 can be fabricated from metal interdigital electrodes 114 and formed onto a piezoelectric substrate 120. In FIG. 1, the left-hand transducer 110 is connected to a source 130 having a source voltage 132 and a source resistance 134. Upon excitation by the electrical signal generated by the source 130, a portion of the electromagnetic energy at the left-hand transducer 110 is converted to acoustic energy and propagates as an acoustic wave upon the surface of the piezoelectric substrate 120 toward the right-hand transducer 112. As the acoustic wave becomes incident upon the right-hand transducer 112, the acoustic energy is converted back into electromagnetic energy and provided to the load 140. In the basic SAW device of FIG. 1, the wavelength of the propagating acoustic wave is proportional to the spacing of the metal interdigital electrodes 114. Thus, the frequency response of a filter using these devices can be modified by varying the spacing between each digit of the metal interdigital electrodes 114.

Figure 2:
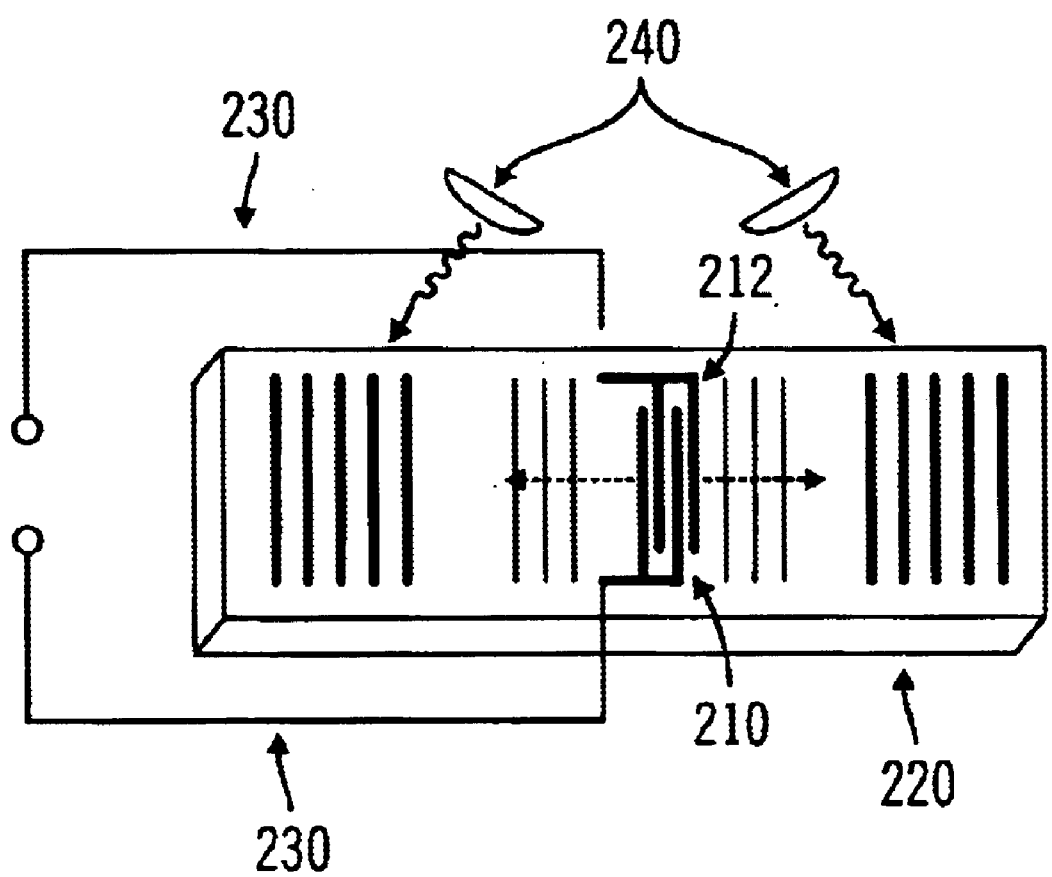
FIG. 2 is a perspective view of a preferred embodiment of the invention.

A preferred embodiment illustrating a method and apparatus of an embodiment of the present invention is shown in FIG. 2. The basic SAW device discussed above is modified by depositing only one transducer 210 having interleaved electrodes 212 onto a piezoelectric substrate 220. Leads 230 are brought out from the transducer electrodes 212 so as to form a single-port device. The transducer 210 may be excited by a signal source (not shown) employing excitation techniques that are common in the art. Typically, the transducer 210 would be excited by an electronic, oscillating waveform of a frequency desired by the user. Excitation of the transducer 210 gives rise to an acoustic wave propagating along the surface of the piezoelectric substrate 220. The regions of the piezoelectric substrate 220 adjacent to either side of the transducer 210 are then illuminated with a light source 240. Upon illumination, the velocity of the acoustic wave propagation along the surface of the piezoelectric substrate 220 will change, and a frequency component of the acoustic wave will be reflected, based on the characteristics, such as wavelength intensity of the light emitted from the light source 240. The wavelength, intensity and other characteristics of the light emitted from the light source 240 may be selected depending on the needs of the user. By varying these and other parameters of the illumination, the user can also vary the velocity and reflected component of the acoustic wave. Subsequent to illumination, a particular frequency component of the acoustic wave, or the acoustic wave itself, both being functions of the illumination, is coupled to the transducer 210 and may be retrieved at the leads 230.

Figure 3:
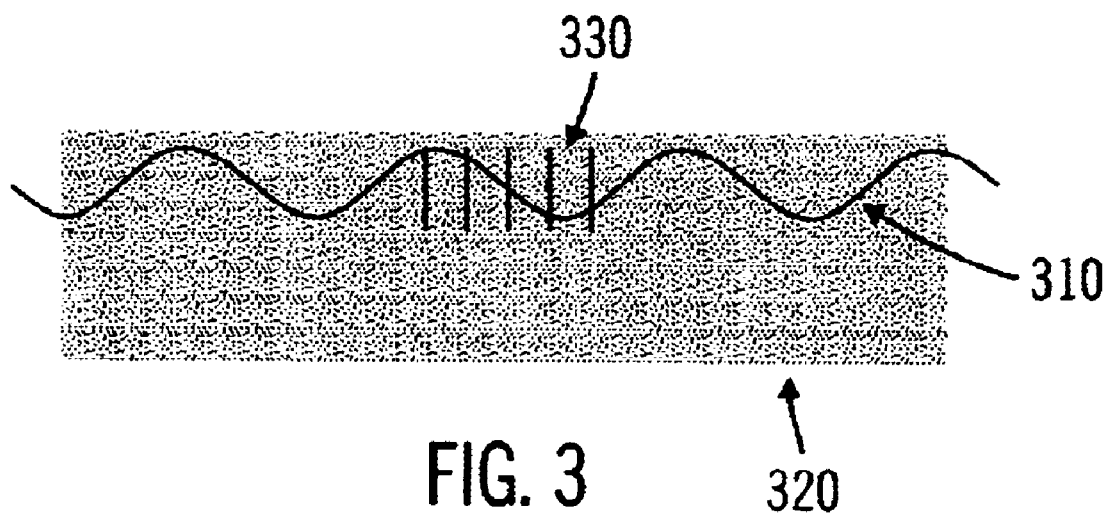
FIG. 3 illustrates the mechanism by which the method and embodiments of the invention may be explained.

A mechanism by which the method and apparatus according to an embodiment of the present invention is accomplished may be explained with reference to FIG. 3. Acoustic waves 310 can propagate on or through the surface of a medium 320, which may have piezoelectric properties, giving rise to dipole moments, or charge imbalances, and a resultant electric field within the medium 320. Conversely, an electric field induced upon or within the medium 320 can give rise to mechanical stress within the medium 320 and resultant acoustic waves. The coupling $K^2$ between the acoustic waves and the electric field may be defined as $$K^2 = e^2/\in c = -2\Delta v/v,$$

where e is the piezoelectric coefficient, $\in$ is the dielectric permittivity, c is the elastic constant, v is the velocity of the propagating acoustic wave in an unperturbed medium, and $\Delta v$ is the change in velocity observed when the surface electric potential is shorted. This factor, which is for a simple isotropic case, quantifies the fractional change in the velocity of the acoustic wave propagation due to the electromechanical coupling.

If the medium 320 is illuminated, free charges appear within the bulk of the medium 320, resulting in an optically induced charge grating 330. The charge grating 330 acts as a variable interdigital or interleaved network and serves to cancel or relax the electric field at various points within the medium 320 in the direction of the propagating acoustic waves 310. These varying fields change the velocity of the acoustic waves 310 incident upon these fields, giving rise to selective reflection of particular frequency components of the acoustic waves 310. This phenomena is commonly referred to as Bragg reflection. The selected frequency can then be coupled out of the medium 320 via transducer (not shown). Various frequencies may be selected by varying the charge grating 330, which is easily accomplished by varying the illumination on the medium 320. The illumination on the medium 320 may be varied using a variety of techniques, for example, using an optical intensity grating (i.e., the intensity distribution varies spatially as a sinusoid with a characteristic grating spacing).

Referring again to FIG. 2, the piezoelectric substrate 220 may be fabricated from a variety of materials. If ferroelectric crystals are desired, lithium niobate ($LiNbO_3$) and lithium tantalate ($LiTaO_3$) may be used. Semiconductors such as gallium arsenide (GaAs) or indium phosphide may also be used. Bismuth germanium oxide ($BI_{12}GeO_{20}$) and related semi-insulators are also candidates. Other embodiments may employ other suitable materials, such materials typically having relatively large electromechanical effects and photoconductivity.

The transducer 210 can be made from any suitable conductive metal or other electrically conductive material. Its exact geometry and spacing depends on the needs of the user. The transducer 210 may be formed on the piezoelectric substrate 220 using any of the methods that are common within the industry, including, but not limited to, deposition processes, etching processes, photolithography, or the like. In some embodiments, the transducer 210 may be formed on the piezoelectric substrate 220 by simple mechanical attachment.

The light source 240 may also be implemented in a variety of ways. Laser diodes may be used if desired. In the event a laser diode does not provide the desired wavelength, light-emitting diodes (LEDs) may be used. LEDs are common in the art and emit a variety of wavelengths, including blue light. Other suitable Vts of light sources may be employed in other embodiments.

Figure 4:
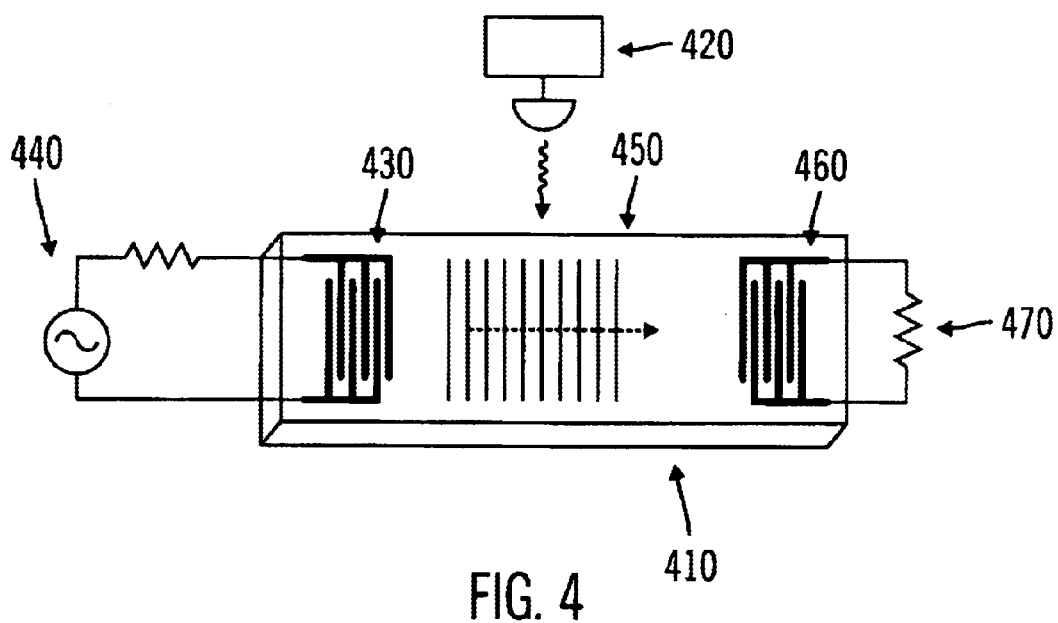
FIG. 4 is a perspective view of another preferred embodiment of the invention.

Another preferred embodiment of a method and apparatus of the present invention is shown in FIG. 4. A basic SAW device 410 having a first transducer 430 and a second transducer 460 is illuminated with a light source 420 having a particular wavelength or wavelengths and a particular intensity. The first transducer 430 is excited by a signal source 440, such as an electronic oscillating waveform, giving rise to an acoustic wave propagating along the surface of the piezoelectric substrate 450. The selected frequency, being a function of the characteristics of the light source 420, is coupled to the second transducer 460 and used at the load 470. Note that in this embodiment, as well as in other embodiments of the method and apparatus of the present invention, there is no need to employ any photoconductive layers to modify the characteristics of the acoustic wave.

The versatility of embodiments of the present invention are readily apparent. By appropriately tuning or varying the characteristics of the light source and/or the illumination of the medium, a desired frequency may be reflected in the medium, or a desired delay in the propagation velocity of the acoustic wave may be achieved, and retrieved via the transducer, all without the use of loss-inducing photoconductive layers. The charge grating resulting from the illumination of the medium functions as a variable interdigital or interleaved network, and may be described as "light fingers." By varying the illumination of the medium, the charge grating is also varied, resulting in a change in the frequency response of the device. Thus, a variable filter or resonator may be achieved.

Further, appropriately tuning or varying the light source and/or the illumination of the medium will result in a desired velocity of the propagating acoustic wave. Thus, variable delay lines may also be easily achieved. Embodiments of the present invention makes it easy to vary light finger spacing, the number of light fingers in a given region of the medium, the ratio of light-to-dark regions in the medium, and other characteristics, all with attendant variations in the frequency response of the device. Although the present invention may be used for any range of frequencies, it is particularly useful in the intermediate frequency range and finds application at frequencies ranging from 10 MHz to 1 GHz and beyond. However, devices utilizing further embodiments of the present invention may be applied to frequencies across the spectrum.

Because embodiments of the present invention do not require that electrical signals pass through photoconductive regions, the resistive losses and attendant degradations in signal levels and signal quality associated with the prior art may be eliminated. Further, because embodiments of the present invention do not rely on prefabricated control structures, device tunability may be easy and inexpensive with respect to those embodiments. Devices according to embodiments of the present invention may be fabricated easily using current solid state technology techniques and may be made as small as current techniques will allow.

Figure 5:
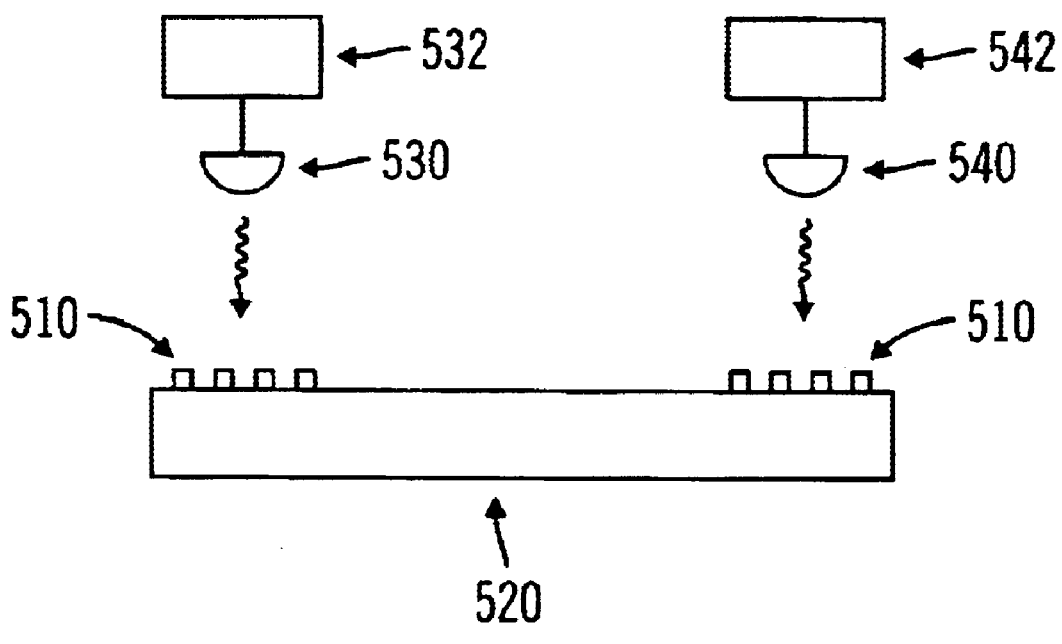
FIG. 5 is a side view of another preferred embodiment of the invention.

Another preferred embodiment demonstrating broad versatility is shown in FIG. 5. Transducers 510 are formed upon a piezoelectric substrate 520 using common techniques. A first light source 530 is controlled by a first controller 532 while a second light source 540 is controlled by a second controller 542. The first light source 530 and the second light source 540 are positioned such that they directly illuminate the transducers 510. The first controller 532 and the second controller 542 can be any suitable type of controller, typically an electronic controller. In one example embodiment, the controllers may be designed with circuitry containing a microprocessor or microcontroller. By operating the first controller 532 and the second controller 542 in such a way that the intensity of the first light source 530 is different from that of the second light source 540, the resulting charge grating at each portion of the piezoelectric substrate 520 will be different, resulting in a particular frequency response for the device. By varying the intensity, the wavelength or other characteristics of each light source 530, 540, a variable acoustic wave device may be achieved. Such devices may include, among other components, variable filters, variable resonators, and variable delay lines.

Figure 6:
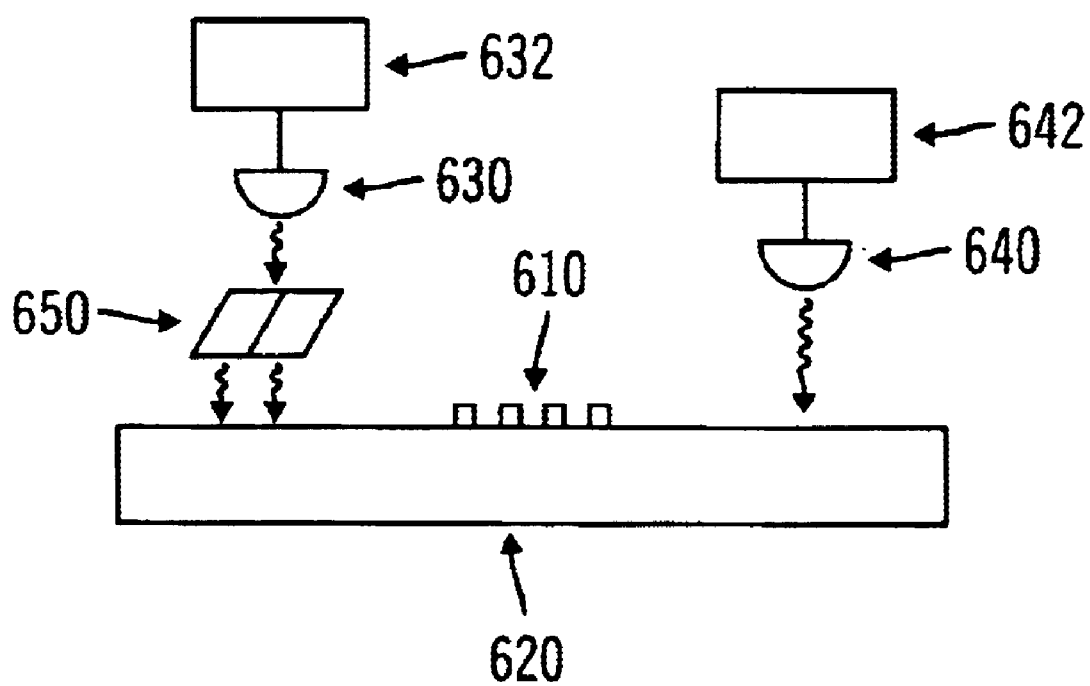
FIG. 6 is a side view of another preferred embodiment of the invention.

A method and apparatus according to another preferred embodiment of the present invention is shown in FIG. 6. This embodiment is similar to the embodiment described in FIG. 2 with the addition, however, of a light modulator 650. A transducer 610 is formed upon a piezoelectric substrate 620, again preferably using common techniques. A first light source 630 is controlled by a first controller 632 while a second light source 640 is controlled by a second controller 642. The first light source 630 and second light source 640 are positioned such that they illuminate the region of the piezoelectric substrate 620 adjacent to either side of the transducer 610. The first controller 632 and the second controller 642 are operated in such a way that the intensity, the wavelength or other characteristics of the first light source 630 and the second light source 640 are about the same. Tunability of the device is achieved by varying the light modulator 650 such that the intensity, the wavelength or other characteristics of the illumination on the region of the piezoelectric substrate 620 under the first light source 630 is different than the intensity, the wavelength or other characteristics of the illumination on the region of the piezoelectric substrate 620 under the second light source 640.

The light modulator may be fabricated in a variety of ways or could be any number of devices. For example, it could be a liquid crystal display (LCD) panel, any type of optical filter, such filters being widely available on the market, any device capable of modulating or varying the intensity, the wavelength, or other characteristics of a light source, or any device that is suitable for grating pattern control.

While particular embodiments of the present invention have been shown and described, it will be obvious to those skilled in the art that the invention is not limited to the particular embodiments shown and described and that changes and modifications may be made without departing from the spirit and scope of the appended claims.

What is claimed is:

1. A method for modifying the characteristics of an acoustic wave, comprising the steps of:
   providing a medium for acoustic wave propagation;
   generating an acoustic wave;
   propagating the acoustic wave using the medium;
   illuminating the medium using a laser diode during the propagation of the acoustic wave; and
   reading a selected frequency component of the acoustic wave.

2. The method of claim 1, wherein the medium is a piezoelectric substrate.

3. The method of claim 2, wherein a transducer is formed on the piezoelectric substrate.

4. The method of claim 3, wherein the acoustic wave is generated by the transducer.

5. A method for modifying the characteristics of an acoustic wave, comprising the steps of:
   providing a medium for acoustic wave propagation;
   generating an acoustic wave;
   propagating the acoustic wave using the medium;
   illuminating the medium using a light emitting diode during the propagation of the acoustic wave;
   reading a selected frequency component of the acoustic wave; and
   varying an intensity of a light generated by the light-emitting diode.

6. The method of claim 5, wherein the intensity of the light is varied by a controller.

7. The method of claim 5, wherein the intensity of the light is varied by a light modulator.

8. An apparatus for varying the characteristics of an acoustic wave, comprising:
   a medium for acoustic wave propagation;
   a transducer formed on the medium; and
   a laser diode light source illuminating the medium,
   wherein a selected frequency component of the acoustic wave is read from the transducer.

9. The apparatus of claim 8, wherein the medium is a piezoelectric substrate.

10. The apparatus of claim 8, wherein the transducer generates an acoustic wave.

11. A method for making an acoustic wave device, comprising the steps of:
    providing a medium for acoustic wave propagation;
    forming a transducer on the medium;
    providing a first light source for illuminating the medium; and
    providing a second light source for illuminating the medium,
    wherein the first light source or the second light source is a laser diode.

12. The method of claim 11, wherein the medium is a piezoelectric substrate.

13. A method for making an acoustic wave device, comprising the steps of:
    providing a medium for acoustic wave propagation;
    forming a transducer on the medium;
    providing a first light source for illuminating the medium;
    providing a second light source for illuminating the medium, and
    providing means for varying an intensity of a light generated by the first light source and the second light source.

14. The method of claim 13, wherein the means for varying the intensity of the light comprises a controller.

15. The method of claim 13, wherein the means for varying the intensity of the light comprises a light modulator.

16. A method for modifying the characteristics of an acoustic wave, comprising:
    providing a medium for acoustic wave propagation;
    generating an acoustic wave;
    propagating the acoustic wave using the medium;
    illuminating a first portion of the medium with a first illumination source operated in a first manner during the propagation of the acoustic wave; and
    illuminating a second portion of the medium with a second illumination source operated in a second manner during the propagation of the acoustic wave;
    wherein the medium is illuminated using a laser diode.

17. The method of claim 16, wherein the medium is a piezoelectric substrate.

18. The method of claim 17, further comprising forming a transducer on the piezoelectric substrate.

19. The method of claim 18, wherein the acoustic wave is generated by the transducer.

20. A method for modifying the characteristics of an acoustic wave, comprising:
    providing a medium for acoustic wave propagation;

generating an acoustic wave;

propagating the acoustic wave using the medium;

illuminating a first portion of the medium with a first illumination source operated in a first manner during the propagation of the acoustic wave;

illuminating a second portion of the medium with a second illumination source operated in a second manner during the propagation of the acoustic wave; and varying a first intensity of the first illumination source and a second intensity of the second illumination source.

21. The method of claim 20, wherein the first intensity and the second intensity are varied by a controller.

22. The method of claim 20, wherein the fist intensity and the second intensity are varied by a light modulator.

23. The method of claim 16, further comprising reading a selected frequency component of the acoustic wave.

24. An apparatus for varying the characteristics of an acoustic wave, comprising:

a medium for acoustic wave propagation;

a transducer formed on the medium for generating an acoustic wave;

a first light source illuminating a first portion of the medium during a propagation of the acoustic wave; and a second light source illuminating a second portion of the medium during a propagation of the acoustic wave;

wherein a selected frequency component of the acoustic wave is read from the transducer; and wherein the first light source or the second light source is a laser diode.

25. The apparatus of claim 24, wherein the medium is a piezoelectric substrate.

26. An apparatus for varying the characteristics of an acoustic wave, comprising:

a medium for acoustic wave propagation;

a transducer formed on the medium for generating an acoustic wave;

a first light source illuminating a first portion of the medium during a propagation of the acoustic wave; and a second light source illuminating a second portion of the medium during a propagation of the acoustic wave;

wherein a selected frequency component of the acoustic wave is read from the transducer; and wherein the intensity of the first light source or the second light source is varied.

27. The apparatus of claim 26, wherein the intensity of the light is varied by a controller.

28. The apparatus of claim 26, wherein the intensity of the light is varied by a light modulator.

29. A method for modifying the characteristics of an acoustic wave, comprising the steps of:

providing a medium for acoustic wave propagation;

generating an acoustic wave;

propagating the acoustic wave using the medium;

illuminating the medium during the propagation of the acoustic wave; and reading a selected frequency component of the acoustic wave;

wherein illuminating the medium comprises illuminating the medium with a light having a selected characteristic;

wherein propagating the acoustic wave comprises propagating an acoustic wave having at least one of a velocity and wavelength dependent upon the selected characteristic of the light; and wherein reading a selected frequency component of the acoustic wave comprises providing the propagating acoustic wave to a transducer to provide an electronic signal dependent upon the selected frequency of the acoustic wave.

30. A method according to claim 29, wherein the selected characteristic of the light comprises at least one of a selected wavelength and a selected intensity.

31. A method according to claim 29, wherein the selected characteristic of the light comprises at least one of a selected wavelength and a selected intensity.

32. An apparatus for varying the characteristics of an acoustic wave, comprising:

a medium for acoustic wave propagation;

a transducer formed on the medium; and a light source illuminating the medium, wherein a selected frequency component of the acoustic wave is read from the transducer wherein the light source comprises a source of light having a selected characteristic, wherein the medium comprises a substrate material for propagating the acoustic wave having at least one of a velocity and wavelength dependent upon the selected characteristic of the light; and wherein the transducer is coupled to receive an acoustic wave propagated by the medium and produce therefrom a signal dependent upon the selected frequency of the acoustic wave.

33. A method according to claim 29, wherein the selected characteristic of the light comprises at least one of a selected wavelength and a selected intensity.

34. A method for making an acoustic wave device, comprising the steps of:

providing a medium for acoustic wave propagation;

forming a transducer on the medium;

providing a first light source for illuminating the medium; and providing a second list source for illuminating the medium, wherein providing a first light source comprises providing a light source for illuminating the medium with a light having a first selected characteristic;

wherein providing a second light source comprises providing a light source for illuminating the medium with a light having a second selected characteristic;

wherein providing a medium comprises providing a substrate material for propagating the acoustic wave having at least one of a velocity and wavelength dependent upon at least one of the first and second selected characteristics of light from the first and second light sources; and wherein the transducer is coupled to receive an acoustic wave propagated by the medium and produce therefrom a signal dependent upon the selected frequency component of the acoustic wave.

35. A method according to claim 34, wherein the selected characteristics of light from each of the first and second light sources comprises at least one of a selected wavelength and a selected intensity.

* * * * *